(12) United States Patent
Yin et al.

(10) Patent No.: US 11,032,906 B2
(45) Date of Patent: Jun. 8, 2021

(54) CONTROL DEVICE FOR UNMANNED AERIAL VEHICLE AND UNMANNED AERIAL VEHICLE

(71) Applicant: Shanghai Topxgun Robotics Co., Ltd., Shanghai (CN)

(72) Inventors: Liangliang Yin, Shanghai (CN); Lianjie Gao, Shanghai (CN); Shaobin Li, Shanghai (CN); Yu Zhang, Shanghai (CN)

(73) Assignee: Shanghai Topxgun Robotics Co., Ltd., Shanghai (CN)

( * ) Notice: Subject to any disclaimer, the term of this patent is extended or adjusted under 35 U.S.C. 154(b) by 401 days.

(21) Appl. No.: 16/088,500

(22) PCT Filed: May 16, 2017

(86) PCT No.: PCT/CN2017/084485
§ 371 (c)(1),
(2) Date: Sep. 26, 2018

(87) PCT Pub. No.: WO2018/196043
PCT Pub. Date: Nov. 1, 2018

(65) Prior Publication Data
US 2021/0100100 A1 Apr. 1, 2021

(30) Foreign Application Priority Data
Apr. 28, 2017 (CN) .......................... 201710293130.2

(51) Int. Cl.
*H05K 1/14* (2006.01)
*B64C 39/00* (2006.01)
(Continued)

(52) U.S. Cl.
CPC ............. *H05K 1/14* (2013.01); *B64C 39/024* (2013.01); *H05K 7/1417* (2013.01);
(Continued)

(58) Field of Classification Search
CPC ...... H05K 1/14; H05K 7/1417; H05K 7/1422; H05K 2201/042–044; H05K 2201/047;
(Continued)

(56) References Cited

U.S. PATENT DOCUMENTS 6,868,314 B1 * 3/2005 Frink ........................ B64C 1/00
701/3
9,527,588 B1 12/2016 Rollefstad
(Continued)

FOREIGN PATENT DOCUMENTS

CN      203909620 U    10/2014
CN      204180445 U     2/2015
(Continued)

OTHER PUBLICATIONS

Supplementary European Search Report and Annex to the European Search Report on European Patent Application No. EP 17 90 2586.1, dated Nov. 29, 2019 (7 pages).
(Continued)

*Primary Examiner* — Hoa C Nguyen
(74) *Attorney, Agent, or Firm* — Buchanan Ingersoll & Rooney PC

(57) ABSTRACT

Provided are a control device for unmanned aerial vehicle and an unmanned aerial vehicle. The control device for unmanned aerial vehicle includes a shell, an inertial measurement device fixed in the shell, a main flight control circuit board electrically connected to the inertial measurement device, and a flexible interface board electrically connected to the main flight control circuit board and appressed against the inwall of the shell. At least one external device is connected to two opposite sides of the flexible interface board through the shell.

18 Claims, 7 Drawing Sheets

(51) Int. Cl.
 *H05K 7/14* (2006.01)
 *B64C 39/02* (2006.01)
(52) U.S. Cl.
 CPC .... *B64C 2201/14* (2013.01); *H05K 2201/042* (2013.01); *H05K 2201/047* (2013.01); *H05K 2201/056* (2013.01); *H05K 2201/10303* (2013.01)
(58) Field of Classification Search
 CPC .......... H05K 2201/056; B64C 2201/00; B64C 2201/14; B64C 39/00; B64C 39/024
 See application file for complete search history.

(56) References Cited

U.S. PATENT DOCUMENTS

| | | | | |
|---|---|---|---|---|
| 2012/0056041 | A1* | 3/2012 | Rhee | B64C 25/32 244/4 R |
| 2013/0111993 | A1* | 5/2013 | Wang | F16F 15/022 73/514.01 |
| 2014/0332620 | A1* | 11/2014 | Earon | B64D 47/08 244/13 |
| 2015/0158392 | A1* | 6/2015 | Zhao | B60L 53/80 320/109 |
| 2017/0210241 | A1* | 7/2017 | Li | B64C 39/024 |
| 2017/0282734 | A1* | 10/2017 | Noorani | B60L 50/64 |
| 2017/0283050 | A1* | 10/2017 | Baek | B64C 39/024 |

FOREIGN PATENT DOCUMENTS

| | | |
|---|---|---|
| CN | 205168871 U | 4/2016 |
| CN | 105573196 A | 5/2016 |
| CN | 205809699 U | 12/2016 |
| CN | 205883822 U | 1/2017 |
| CN | 206671895 U | 11/2017 |
| DE | 102005047873 A1 | 4/2007 |

OTHER PUBLICATIONS

International Search Report for PCT/CN2017/084485 dated Jan. 25, 2018 (Chinese).

* cited by examiner

CONTROL DEVICE FOR UNMANNED AERIAL VEHICLE AND UNMANNED AERIAL VEHICLE

CROSS REFERENCE TO RELATED APPLICATIONS

This application is the United States national phase under 35 U.S.C. § 371 of PCT International Patent Application No. PCT/CN2017/084485, filed on May 16, 2017, which claims benefit of priority of Chinese Application No. 201710293130.2, filed on Apr. 28, 2017.

TECHNICAL FIELD

The present disclosure relates to the field of unmanned aerial vehicles, and in particular to a control device for unmanned aerial vehicle and an unmanned aerial vehicle.

BACKGROUND

Unmanned aerial vehicles are unpiloted aircrafts operated by a programmed control device thereon or a radio remote control device. With the development of science and technology, the technology of unmanned aerial vehicles is increasingly mature. The unmanned aerial vehicles are widely used for their high speed and flexible operation.

In the flight of an unmanned aerial vehicle, a control device is required for controlling and navigating the unmanned aerial vehicle. The control device controls the attitude of the unmanned aerial vehicle feedbacks the location of the unmanned aerial vehicle, so as to implement the attitude control and positioning of the unmanned aerial vehicle. In the related art, the control device for the unmanned aerial vehicle takes use of the inertial measurement device inside the control device to analyze the information on the attitude and location, and implements the navigation of the unmanned aerial vehicle.

SUMMARY

The present disclosure provides a control device for unmanned aerial vehicle and an unmanned aerial vehicle, solving the problem in which low integration level and influence of vibration on the control device for unmanned aerial vehicle in the related art.

The arrangement of the control device for unmanned aerial vehicle described above improves the reliability of the unmanned aerial vehicle system.

A control device for unmanned aerial vehicle control device is provided, which includes:
  a shell;
  an inertial measurement device fixed in the shell;
  a main flight control circuit board electrically connected to the inertial measurement device; and
  a flexible interface board electrically connected to the main flight control circuit board and appressed against an inwall of the shell,
  at least one external device is connected to two opposite sides of the flexible interface board through the shell.

In one or more embodiments, the flexible interface board includes:
  a first interface board and a second interface board opposite to each other; and
  a first flexible board connected to the first interface board and the second interface board,
  the first interface board and the second interface board are provided with pin headers, and the pin headers are electrically connected to external device, the first flexible board is electrically connected to the main flight control circuit board.

In one or more embodiments, the flexible interface board further includes:
  a flexible power supply board electrically connected to the second interface board; and
  a second flexible board electrically connected to the flexible power supply board,
  the second flexible board is located between the flexible power supply board and the second interface board, the second flexible board is used to shield the electromagnetic interference between the flexible power supply board and the second interface board.

In one or more embodiments, header connectors are provided on opposite sides of the shell. The pin headers on the first interface board and the second interface board are electrically connected to the external device through the header connectors.

In one or more embodiments, the first interface board and the second interface board each is fixed on the inside of a respective one of the header connectors by a fastener;
  limiting boards each is provided on the outside of one of the first interface board and the outside of the second interface board, and the limiting boards are locked in the header connectors.

In one or more embodiments, the device further includes a limiting frame disposed in the shell and nested outside the inertial measurement device; the first interface board, the main flight control circuit board and the flexible power supply board are respectively attached to the outside of three sides of the limiting frame.

In one or more embodiments, a lock bump is provided on an extended part of a side surface of the limiting frame, an interstice is formed between the lock bump and a sidewall of the limiting frame, and an end of the flexible power supply board, closing to the first flexible board, is placed in the interstice.

In one or more embodiments, the shell includes an upper shell and a bottom cover connected to each other. Slots are opened on opposite sides of the upper shell. The header connectors are detachably plugged into the slots. The limiting boards are locked in the slots. A limiting convex platform is provided on the ceiling of the upper shell. The inertial measurement device is limited by the limiting convex platform and is supported by the bottom cover.

In one or more embodiments, an arc bump is provided on the side of the limiting frame without the first interface board, the main flight control circuit board and the flexible power supply board. A lock slot for locking the arc bump is provided on an inwall of the upper shell,
  a notch is provided at the top of a side of the limiting frame, a bar bump is provided on the bottom cover and is configured to be locked in the notch.

An unmanned aerial vehicle is provided, which includes the control device described above.

The control device with the structure described above not only has a compact structure of multiple parts and improves the integration level of the entire control device, but also reduces the influence of vibration on inertial measurement device and improve the measurement stability of the inertial measurement device. The flexible interface board attached to the inwall of the shell integrates multiple existing separate interface boards, thereby improving the stability of the flexible interface board installed in the shell and enabling the flexible interface board to be folded at will. Therefore, the installation space is reduced and the volume of the entire control device is reduced. The pin headers are provided on opposite sides of the flexible interface board and the header connectors are provided on opposite sides of the shell to avoid the problem of misplug.

The unmanned aerial vehicle described above, in which the control device described above is installed, improves the accuracy of the detection and control of the unmanned aerial vehicle, and improves the flight reliability of the unmanned aerial vehicle system.

1: upper shell; 2: header connector; 3, inertial measurement device; 4: main flight control circuit board; 5: flexible interface board; 6: limiting frame; 7: bottom cover; 1.1: slot; 1.2: limiting convex platform; 1.3: lock slot; 1.4: first locating pin-hole; 2.1: second locating pin-hole; 2.2: socket; 2.3: pin header holes; 3.1: annular housing; 3.2: upper metal sheet; 3.3: lower metal sheet; 3.4: male tab; 3.5: through-hole; 3.6: first integrated circuit board; 3.7: second integrated circuit board; 3.8: second flexible flat cable; 3.9: first cushion; 3.1': first weighting piece; 3.2': second weighting piece; 3.3': second cushion; 3.4': holding cavity; 3.5': pressure chamber; 5.1: pin header; 5.2: first interface board; 5.3: second interface board; 5.4: first flexible board; 5.5: flexible power supply board; 5.6: second flexible board; 5.7: limiting board; 5.8: nut; 6.1: lock bump; 6.2: interstice; 6.3: arc bump; 6.4: notch; 7.1: bar bump.

DETAILED DESCRIPTION

The control device of unmanned aerial vehicles in the related art usually have the problems as follows.

(1) The integration level of the control device is low. The structure of the parts in the control device is not compact. During the flight of the unmanned aerial vehicle, the vibration is generated. The vibration has influence on the measurement of the inertial measurement device, resulting in inaccurate measurement data.

(2) The interface boards of the control device that are connected to the circuit board on the control device are usually separately arranged. The installation of the interface board requires enough space in the control device, resulting in the increasement of the volume of the control device and the complexity of the structure thereof. The separate interface boards have relatively poor stability and are vulnerable to the vibration. The large number of external interfaces existing in the control device can possibly cause misplug in use.

Figure 1:
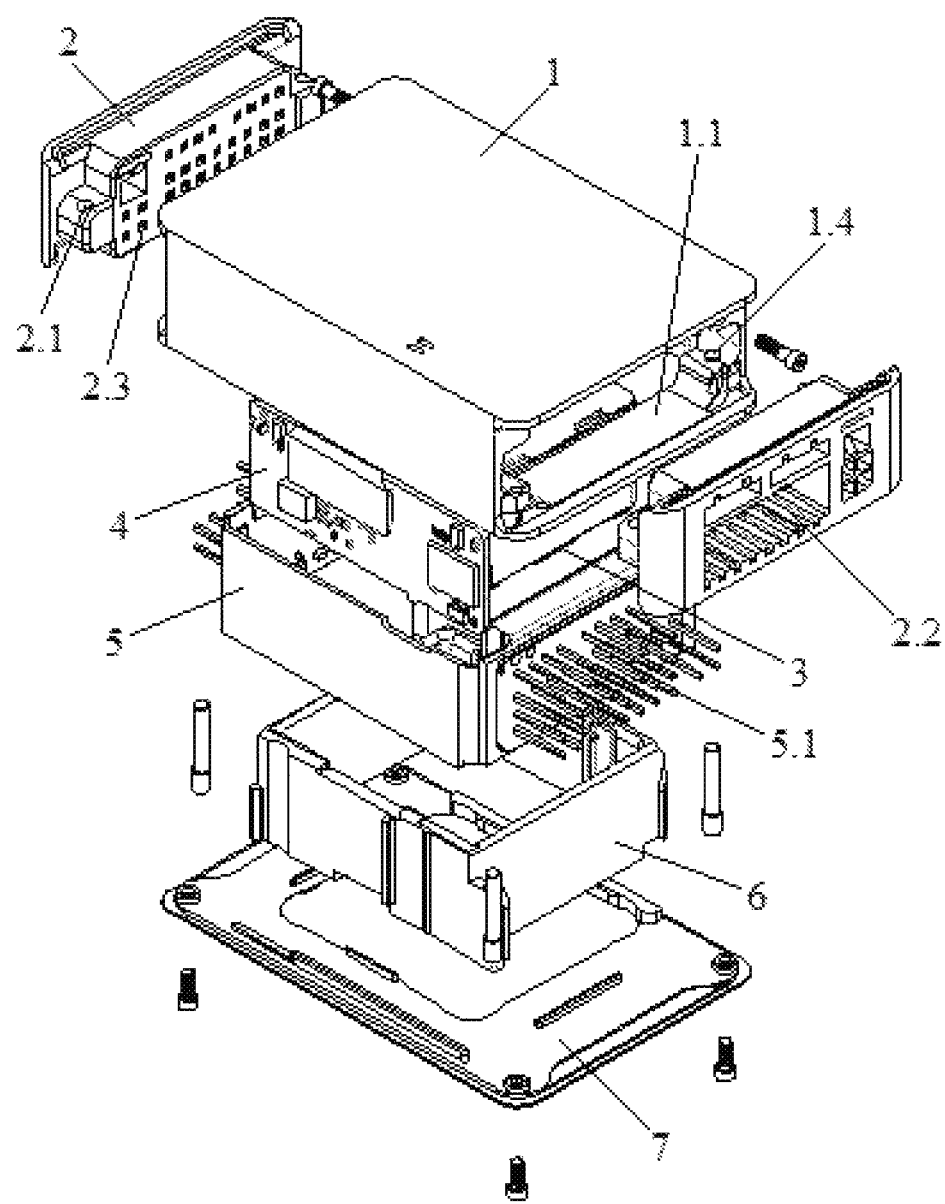
FIG. 1 is an exploded view of a control device according to an embodiment.

This embodiment provides a control device for unmanned aerial vehicle control device. As shown in FIG. 1, the control device includes a shell, header connectors 2, an inertial measurement device 3, a main flight control circuit board 4, an flexible interface board 5 and a limiting frame 6.

Figure 2:
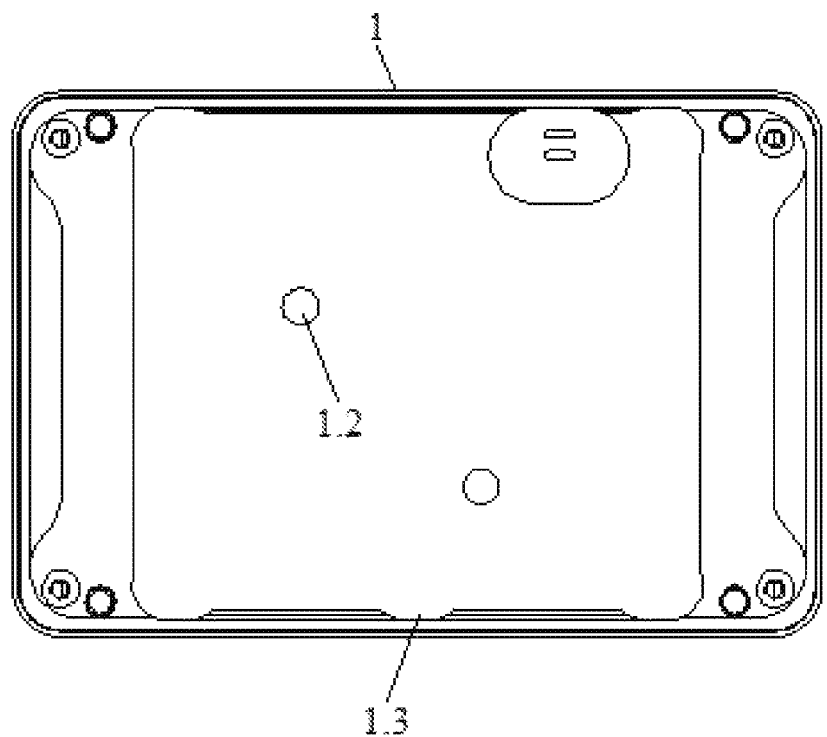
FIG. 2 is a structure diagram of an upper shell according to an embodiment.
Figure 3:
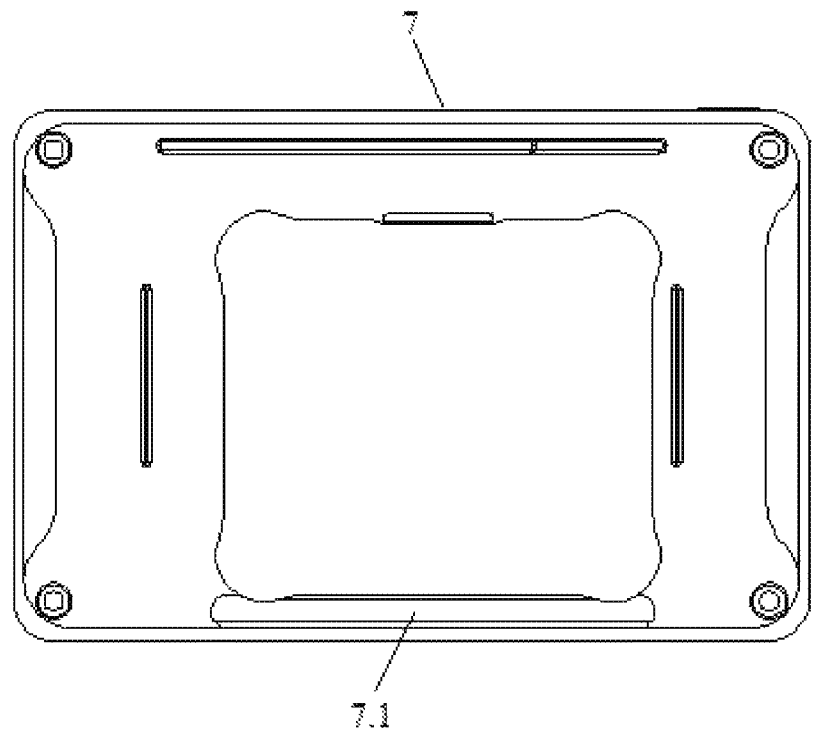
FIG. 3 is a structure diagram of a bottom cover according to an embodiment.

In one or more embodiments, the shell includes an upper shell 1 and a bottom cover 7. As shown in FIG. 2 and FIG. 3, connecting holes are provided at the four corners of the upper shell 1 and the bottom cover 7. The upper shell 1 and the bottom cover 7 are fixedly connected by connectors through the upper shell 1 and the bottom cover 7.

The upper shell 1 may be hollow. As shown in FIG. 2, two limiting convex platforms 1.2 are provided on the ceiling of the upper shell 1. The limit convex platforms 1.2 are used to limit and fix the inertial measurement device 3. In one or more embodiments, an arc lock slot 1.3 is provided on one inner wall of the upper shell 1. The card slot 1.3 is used to limit the limiting frame 6. In one or more embodiments, slots 1.1 are symmetrically slotted through two opposite sides of the upper shell 1. First locating pin-holes 1.4 are provided on the upper and lower sides of both ends of one slot 1.1. The header connectors 2 described above may be inserted horizontally into the slots 1.1, and may be fixed to the first locating pin-holes 1.4 of the slots 1.1 by means of locating pins (not shown).

In one or more embodiments, as shown in FIG. 3, a bar bump 7.1 is provided on the bottom cover 7. The bar bump 7.1 is used to limit the limiting frame 6. The limiting frame 6 is limited in the shell, and the influence of the vibration on the limiting frame 6 is reduced.

In this embodiment, the upper shell 1 and the bottom cover 7 are connected by connectors. This enables the inertial measurement device 3, the flexible interface board 5 and the limiting frame 6 to be compressed by the upper shell 1 and the bottom cover 7. This makes the position of the inertial measurement device 3, the position of the flexible interface board 5 and the position of the limiting frame 6 stable and reduces the influence of vibration on the inertial measurement device 3, the flexible interface board 5 and the limiting frame 6.

In this embodiment, optionally, as shown in FIG. 1, the number of the header connectors 2 is two, and the two header connectors 2 are respectively inserted into the slots 1.1 on opposite sides of the upper shell 1. Second locating pin-holes 2.1 may be arranged vertically at positions on both ends of each header connector 2 corresponding to first locating pin-holes 1.4. The locating pins pass through the first locating pin-holes 1.4 and the second locating pin-holes 2.1 up to down in sequence. The header connectors 2 are detachably installed in the slots 1.1 by means of the first locating pin-holes 1.4. In comparison with the related art in which the upper shell and the pin headers are integrated, the header connectors 2 detachably installed on the upper shell 1 in the embodiment can be produced separately and can be processed easily. Furthermore, the header connectors 2 can be replaced at any time without replacing the upper shell 1, which reduces the cost and improves the appearance of the shell. In this embodiment, the header connectors 2 described above may be plastic parts, so as to facilitate the processing of the header connectors 2 and reduce the processing cost.

The header connectors described above may be provided with sockets 2.2, in which plugs of external devices may be inserted. Pin header holes 2.3 corresponding to the pin header 5.1 on the flexible interface board 5. The pin headers 5.1 on the flexible interface board 5 can be inserted in the pin header holes 2.3 to realize electrically connection between the header connectors and the plugs of the external devices.

Figure 4:
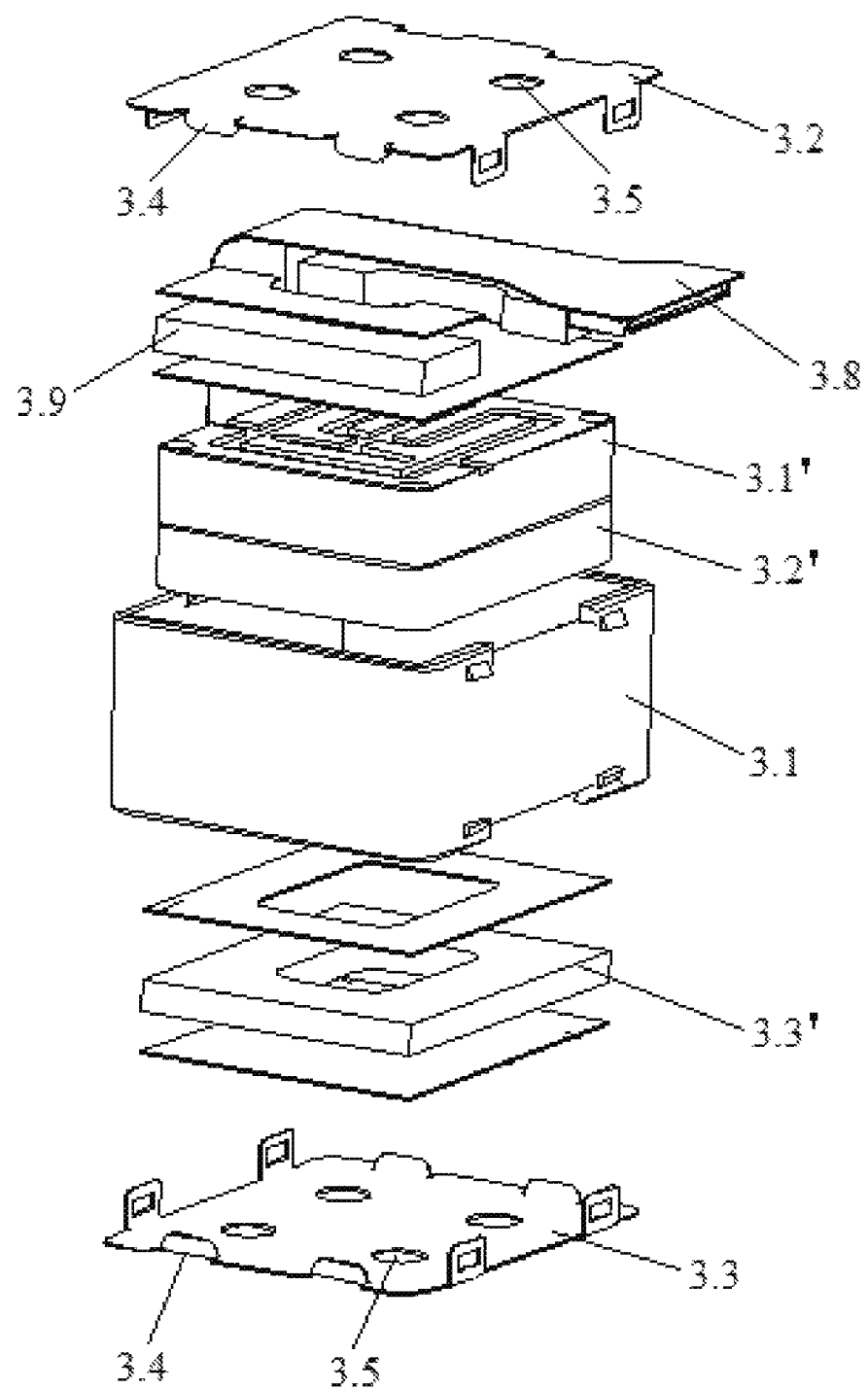
FIG. 4 is exploded view of an inertial measurement device according to an embodiment.

As shown in FIG. 4, the inertial measurement device 3 is installed in the upper shell 1 and is compressed by the bottom cover 7 in the upper shell 1. In one or more embodiments, the inertial measurement device 3 includes a first shell, sensor components installed in the shell and vibration damping components installed in the shell. The first shell may include an annular housing 3.1, an upper metal sheet 3.2 and a lower metal sheet 3.3. The upper metal sheet 3.2 and the lower metal sheet 3.1 respectively locates above and below the annular housing 3.1. The sensor components and the vibration damping components described above are placed in the annular housing 3.1 and supported by the lower metal sheet 3.3. The upper metal sheet 3.2 and the lower metal sheet 3.3 may be fixed on the annular housing 3.1 by means of buckles and snap holes. In one or more embodiments, two male tabs 3.4 extend from two opposite edges of the upper metal sheet 3.2, and two male tabs 3.4 extend from two opposite edges of the lower metal sheet 3.3. The male tabs 3.4 described above may be inserted into the annular housing 3.1 and is appressed against the inwall of the annular housing 3.1. This structure can avoid the annular housing 3.1 from deforming, improve the rigidity of the annular housing, serves as a stiffener. The structure also makes the first shell more stable and reduces the influence of vibration on the sensor components in the first shell.

In this embodiment, optionally, four through-holes 3.5 are opened in the upper metal sheet 3.2 and four through-holes 3.5 in the lower metal sheet 3.3. When the entire inertial measurement device 3 is installed in the shell, two limiting convex platforms 1.2 on the ceiling of the upper shell 1, are inserted into two through-holes 3.5 of the lower metal sheet 3.3. The location of the inertial measurement device 3 is limited. The inertial measurement device 3, fixed in the upper shell 1, is supported by the bottom cover 7.

Figure 5:
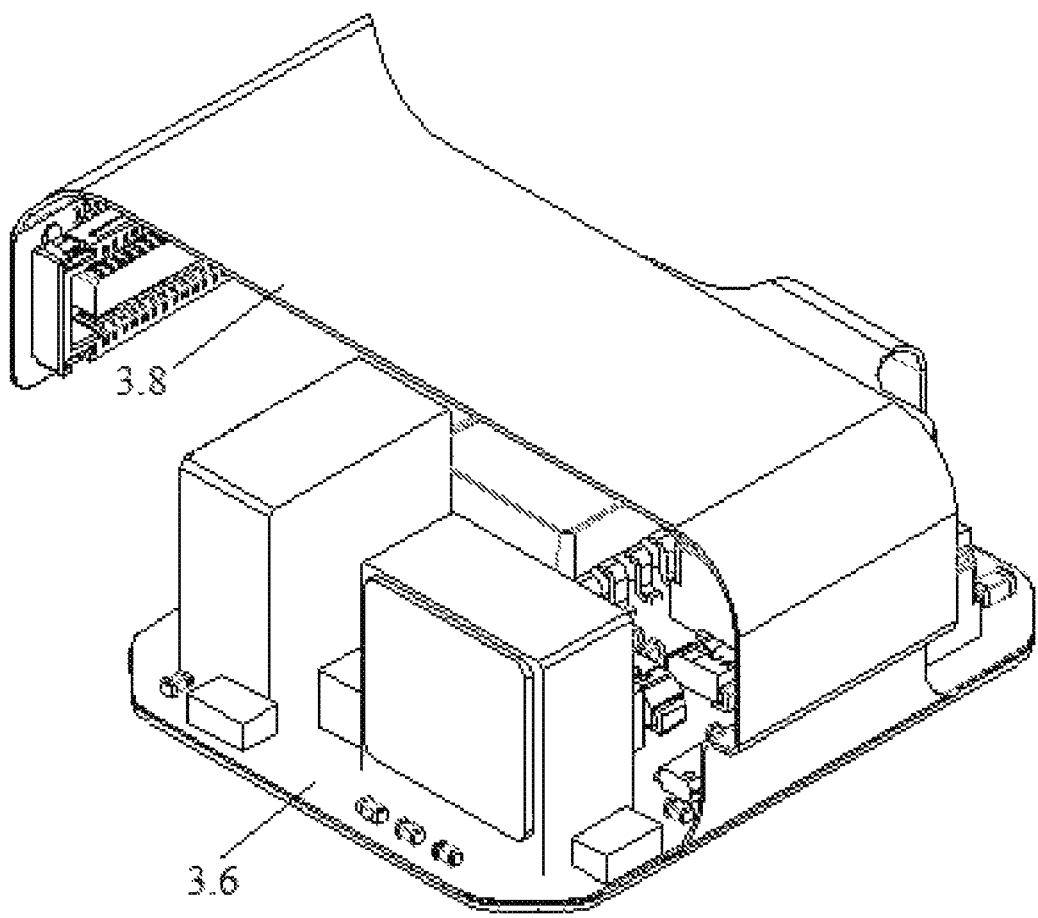
FIG. 5 is a structure diagram of sensor components of an inertial measurement device according to an embodiment, in which a first integrated circuit board is illustrated.
Figure 6:
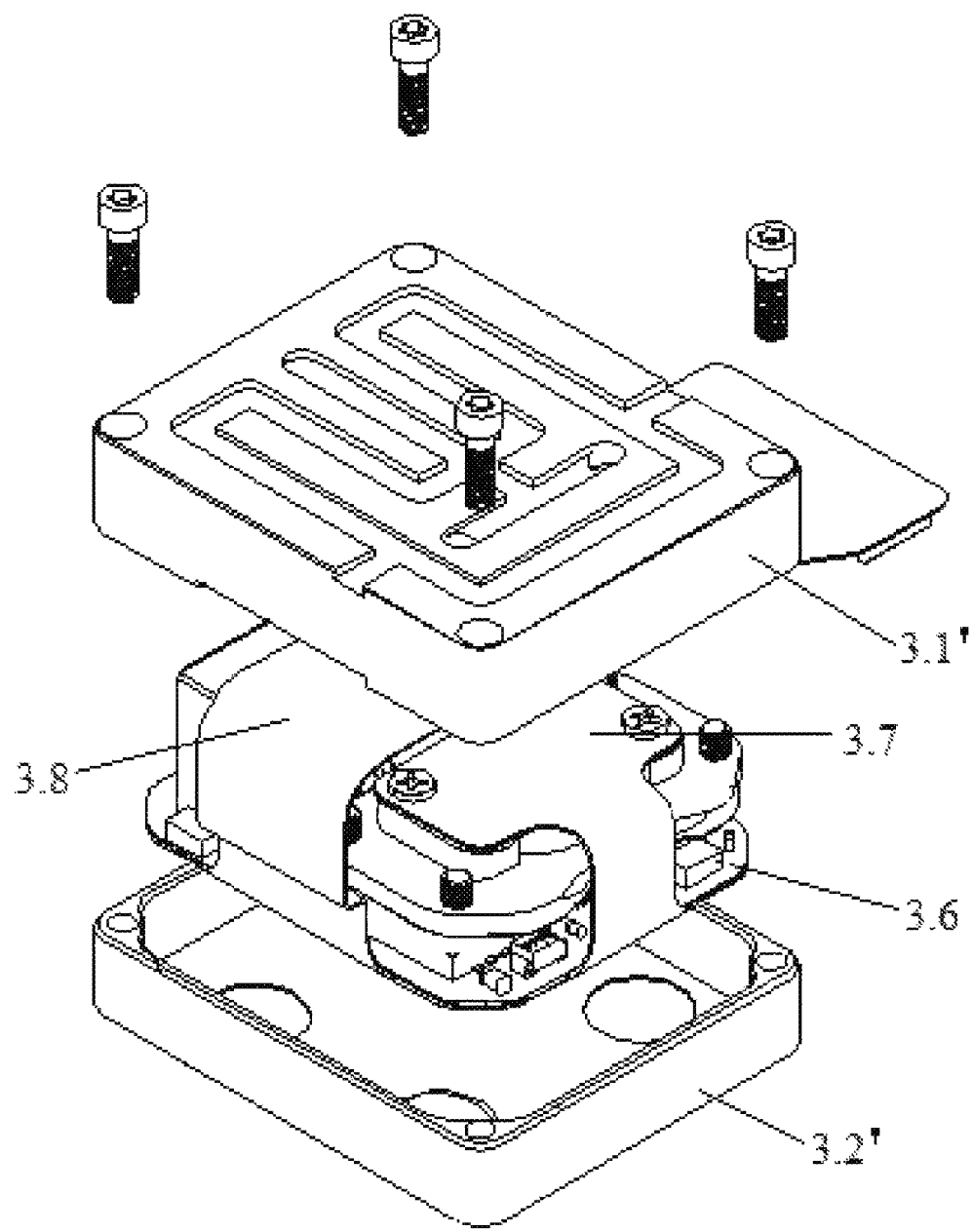
FIG. 6 is a structure diagram of sensor components of an inertial measurement device according to an embodiment, in which a first integrated circuit board is illustrated.

In one or more embodiments, as shown in FIG. 5 and FIG. 6, the sensor components include a first integrated circuit board 3.6 and a second integrated circuit board 3.7. The first integrated circuit board 3.6 and the second integrated circuit board 3.7 may be connected by a first flexible flat cable (not shown). The first integrated circuit board 3.6 is be equipped with an inertial sensor (not shown) and a second flexible flat cable 3.8. The second integrated circuit board 3.7 is equipped with a barometric sensor. The second flexible flat cable 3.8 is connected to the main flight control circuit board 4. The signals coming from the sensors on the first integrated circuit board 3.6 and the second integrated circuit board 3.7 are transmitted to the main flight control circuit board 4 via the second flexible flat cable 3.8. Therefore, the data coming from multiple sensors of a same type can be fused, and data coming from multiple sensors of different types can be integrated. As such, the reliability, validity, stability and accuracy of measurement data are improved. The sensor components described above may collect information on the flight conditions of the unmanned aerial vehicle in real time. The collected data may include triaxial attitude angle or angular speed, as well as acceleration and triaxial orientation.

Figure 7:
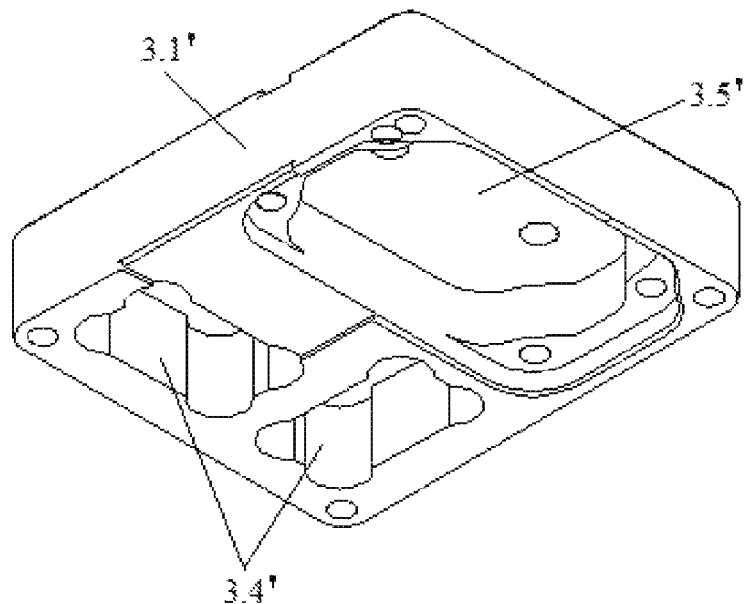
FIG. 7 is a structure diagram of a first weighting piece of an inertial measurement device according to an embodiment.

In one or more embodiments, as shown in FIG. 4, the vibration damping components described above include a first cushion 3.9, a first weighting piece 3.1', a second weighting piece 3.2' and a second cushion 3.3' which are connected successively up to down. The sensor components described above may be located in the space between the weighting piece 3.1' and the second weighting piece 3.2'. In one or more embodiments, at least one holding cavity (not shown) for accommodating the sensor components is formed between the first weighting piece 3.1' and the second weighting piece 3.2'. The first integrated circuit board 3.6 may be disposed in the second weighting piece 3.2'. As shown in FIG. 7, the first weighting piece 3.1' has the holding cavity 3.4' and a pressure chamber 3.5'. The number of the at least one holding cavity 3.4' may be two. The holding cavity 3.4' may be used to respectively accommodate a gyroscope and an accelerometer of the inertial sensor. The pressure chamber 3.5' communicates with the exterior and accommodate the second integrated circuit board 3.7 and the barometric sensor on the second integrated circuit board 3.7. The arrangement of the sensor components in the inner space of the first weighting piece 3.1' and the second weighting piece 3.2' can avoid the need for additional space for the sensor components, which increases the integration level of the inertial measurement device. The holding cavities (i.e., the holding cavity 3.4' and the pressure chamber 3.5') can reduce the influence of the vibration on the inertial sensor and reduce interference from high speed turbulence to the barometric sensor, thus improving the precision of measurement of the inertial sensor and the barometric sensor.

In one or more embodiments, the holding cavity described above is filled with thermally conductive silicone grease. A sealing cover (not shown) may be installed on the pressure chamber 3.5'. The sealing cover and the pressure chamber 3.5' can be connected by a connector. The sealing cover is used to seal the pressure chamber 3.5'. The sealing of the pressure chamber 3.5' with the sealing cover, enables the pressure chamber 3.5' to be isolated from the holding cavity formed between the first weighting piece 3.1' and the second weighting piece 3.2'. This avoids the influence of thermally conductive silicone grease on the air pressure in the pressure chamber 3.5' and improves the precision of the measurement result from the barometric sensor in the pressure chamber 3.5'.

The filled thermally conductive silicone grease can mitigate the vibration, maintain the temperature of all the components on the first integrated circuit board 3.6 within a certain range and evenly heated, and avoid the vibration from the components themselves. The filled thermally conductive silicone grease enables multiple components on the integrated circuit board to form a whole and vibrate at a same frequency to mitigate the vibration.

Both the first cushion 3.9 and the second cushion 3.3' described above may be made of porous and breathable material. This can avoid local turbulence caused by the wind at excessive speed, avoid the rapid entry of air into the pressure chamber 3.5', buffer and isolate vibration, reduce common vibration frequency and buffer high-speed turbulence.

In this embodiment, a main control unit (not shown) may be integrated on the main flight control circuit board 4 described above. The main control unit may be used to control the unmanned aerial vehicle and mission equipment. The main control unit may receive information from the sensor components of inertial measurement unit 3 and perform the fusion of the data from the sensing components, so as to generate a control signal and produce a control command for the flight of the unmanned aerial vehicle. The main control unit may be embodied by any one of the followings: an advanced RISC machine (ARM), a digital signal processor (DSP) and a microcontroller.

Figure 8:
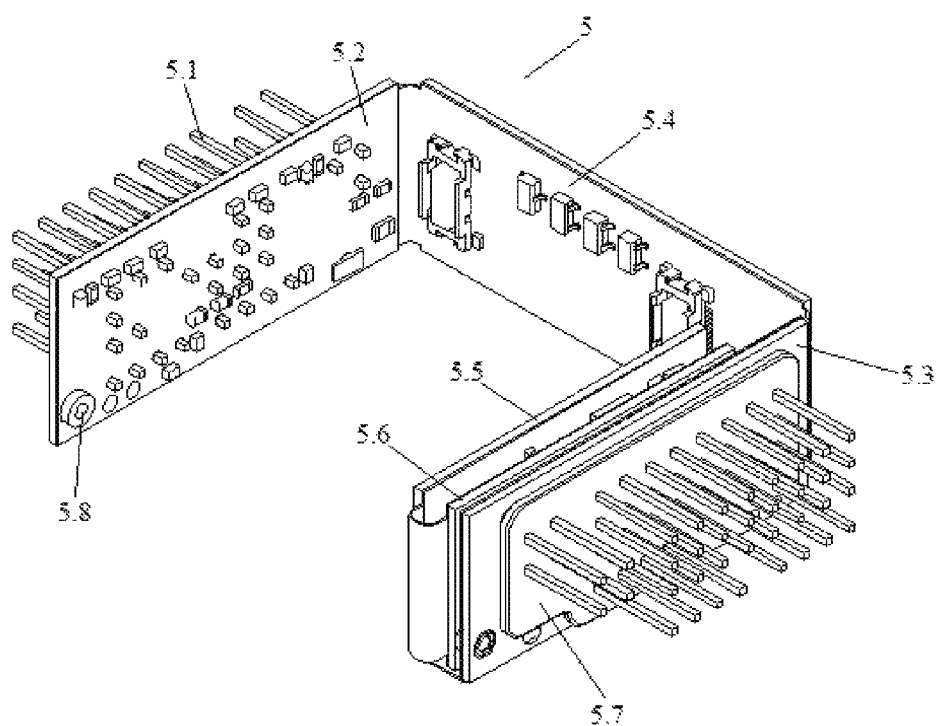
FIG. 8 is a structure diagram of an installed flexible interface circuit board according to an embodiment.
Figure 9:
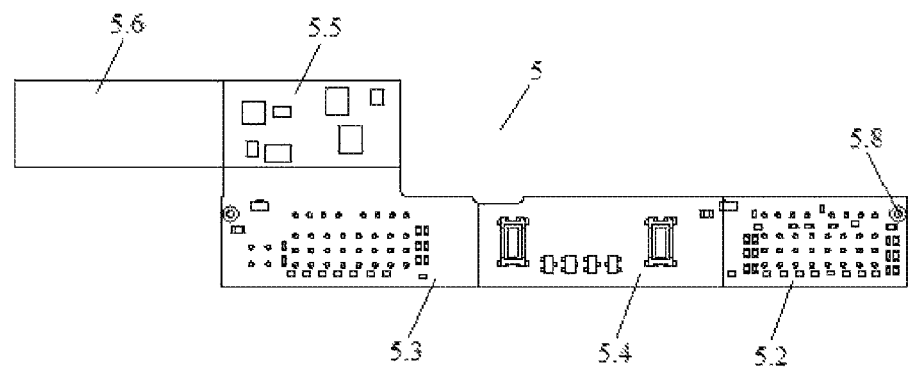
FIG. 9 is a structure diagram of an expanded flexible interface board according to an embodiment.

As shown in FIG. 8 and FIG. 9, the flexible interface board 5 described above may be a flexible circuit board. The flexible interface board 5 has the characteristic of being folded at will and reducing space. The flexible interface printed circuit board 5 may be provided with a power unit for supply power for the entire control device and an interface connected to the mission equipment. The interface may be one or more of the followings: a serial port, an inter-integrated circuit (IIC) bus interface, a serial peripheral interface (SPI) bus interface and a controller area network (CAN) bus interface.

In one or more embodiments, the flexible interface board 5 includes a first interface board 5.2 and a second interface board 5.3 which are oppositely arranged, as well as a first flexible board 5.4 connected to the first interface board 5.2 and the second interface board 5.3. The first interface board 5.2, the second interface board 5.3 and the first flexible board 5.4 described above may be attached to the inwall of the upper shell 1, such that the flexible interface board 5 is more firmly installed in the upper shell 1. The space utilization is reasonable, increasing the integration level and reducing the volume of the whole control device. In one or more embodiments, the flexible interface board 5 includes pin headers. The pin headers of the flexible interface board 5 are arranged on the first interface board 5.2 and the second interface board 5.3. A board-to-beard connector (not shown) is provided on the first flexible board 5.4. The first flexible interface board 5.4 is connected to the main flight control circuit board 4 through the board-to-board connector.

In one or more embodiments, a flexible power supply board 5.5 is connected on one side of the second interface board 5.3. A second flexible board 5.6 is provided between the flexible power supply board 5.5 and the second interface board 5.3. The second flexible board 5.6 can be covered with a copper sheet, which can shield the electromagnetic interference between the power source flexible board 5.5 and the second interface board 5.3.

In this embodiment, optionally, the first interface board 5.2 and the second interface board 5.3 are attached to the inwall of the upper shell 1. In one or more embodiments, nuts 5.8 are provided on the first interface board 5.2 and the second interface board 5.3. Correspondingly, first holes are provided on the slots 1.1 of the upper shell 1. Fasteners, such as bolts, pass through the first holes and are connected to the nuts 5.8, which enable the first interface board 5.2 and the second interface board 5.3 to be fixed inside two opposite sides of the upper shell 1 provided with the slots 1.1, and limit the back-and-forth motion of the flexible interface board 5. When the first interface board 5.2 and the second interface board 5.3 are fixed in the upper shell 1, the first flexible interface board 5.4 is attached to one side wall of the upper shell 1. In the structure described above, the flexible interface board 5 can be fixed in the upper shell 1 and the influence of vibration on the flexible interface board 5 can be reduced.

As shown in FIG. 8, in this embodiment, limiting boards 5.7 may also be provided on the outside of the first interface board 5.2 and the second interface board 5.3. The area of the limiting board 5.7 is smaller than the area of each of the first interface board 5.2 and the area of the second interface board 5.3. The limiting board may be locked in the slot 1.1, which can limit the up-and-down motion and the left-and-right motion of the flexible interface board 5. The first flexible interface board 5.2 and the second flexible interface board 5.3 are fixed in the upper shell 1 with the bolts and nuts 5.8, which can limit the back-and-forth motion of the interface flexible printed circuit board. The whole flexible interface board 5 is limited in the upper shell 1, which reduce the influence of vibration on the flexible interface board.

The first interface board 5.2, the second interface board 5.3, the first flexible board 5.4, the flexible power supply board 5.5 and the second flexible board 5.6 each may be formed by folding the expanded flexible interface board 5, as shown in FIG. 9. According to the dimension of the upper shell 1, the upper shell 1 may be folded into the flexible interface board adapted to the upper shell 1, saving the installing space of the flexible interface board 5, making the arrangement of the multiple components on the flexible interface board reasonable and reducing the volume of the entire control device. According to the dimension of the upper shell 1, we can adjust the flexible interface board to improve the stability of the installation of the flexible interface board, and reduce the influence of the vibration on the flexible interface board.

Figure 10:
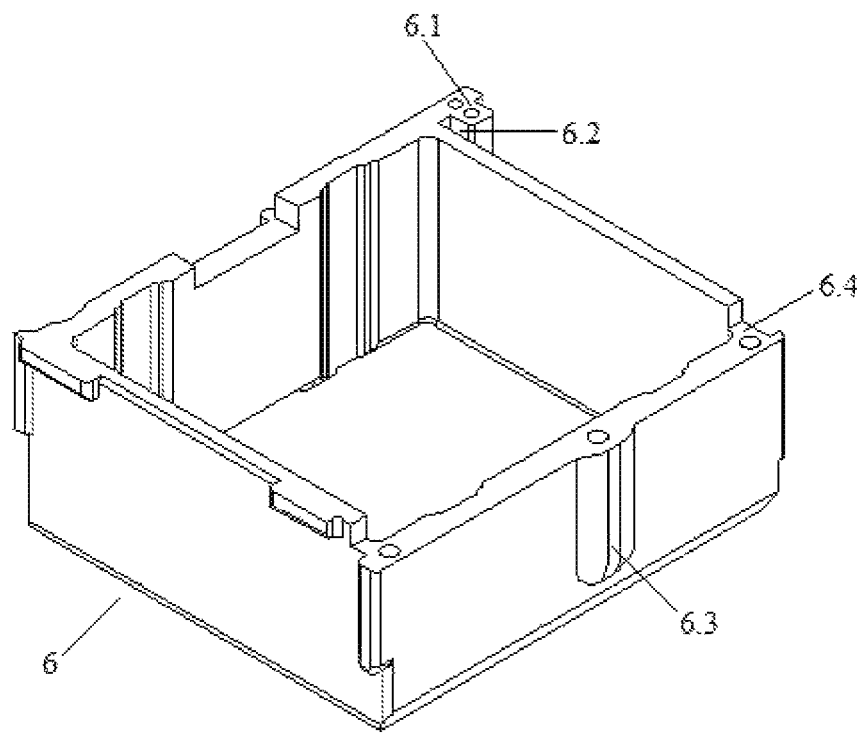
FIG. 10 is a structure diagram of a limiting frame according to an embodiment.

As shown in FIG. 10, the limiting frame 6 described above may be supported by the bottom cover 7 and may be fixed in the upper shell 1. The bottom cover 7 presses the limiting frame 6 tightly in the upper shell 1. The limiting frame 6 may be nested outside the first shell of the inertial measurement device 3. The first interface board 5.2 and the flexible power supply board of the flexible interface board 5, as well as the main flight control circuit board 4, may be attached to the outside of the limiting frame 6. In one or more embodiments, a lock bump 6.1 may be provided on the extended part of one side surface of the limiting frame 6. An interstice is formed between the lock bump 6.1 and a sidewall of the limiting frame 6. When the limiting frame 6 is installed, the lock bump 6.1 described above is located between the flexible power supply board 5.5 and the second flexible board 5.6, and one end of the flexible power supply board 5.5 is locked in the interstice 6.2. The lock bump 6.1 separates the flexible power supply board 5.5 and the second flexible board 5.6, thus preventing the second flexible board 5.6 from coming in contact with the flexible power supply board 5.5 to press the component s on the flexible power supply board 5.5. The lock bump 6.1 also supports the second flexible board 5.6, making the second flexible board 5.6 against the first interface board 5.2; and supports the pin headers 5.1 on the first flexible board, protecting the pin headers 5.1 from the damage caused by large stress.

In one or more embodiments, an arc bump 6.3 is provided on one side of the limit frame 6 without the first interface board 5.2, the main flight control circuit board 4 and the flexible power supply board 5.5. The arc bump 6.3 can be inserted into the arc-shaped card slot 1.3 of the upper shell 1. The arc bump 6.3 and an arc-shaped lock slot 1.3 cooperate with each other to limit the limiting frame 6 in the upper shell 1.

In one or more embodiments, a notch 6.4 is provided on the top of the limiting frame 6. A bar bump 7.1 of the bottom cover 7 may be locked in the notch 6.4, and may limit the limiting frame 6. The limitation to the limiting frame 6 can reduce the influence of the vibration on the limiting frame 6, and reduce the influence on the flexible interface board 5 and the inertial measurement device 3.

In this embodiment, when the control device is installed, the flexible interface board 5 may be installed on the corresponding position of the upper shell 1, and may be fixed on the side wall of the slots 1.1 on the upper shell 1 by bolts. The header connecters 2 are plug into the slot 1.1 and are fixed in the slot 1.1 with the locating pins. The inertial measurement device 3 is disposed into the corresponding position of the upper shell 1. The limiting convex platforms 1.2 of the upper shell 1 are inserted into the through-holes 3.5 on the lower metal sheet 3.3 of the inertial measurement device 3, and the location of the inertial measurement device 3 is limited. The main flight control circuit board 4 and the first flexible board 5.3 of the flexible interface board 5 are connected by the board-to-board connector. The second flexible flat cable 3.8 of the inertial measurement device 3 is connected to the main flight control circuit board 4. The limiting frame 6 is installed in such a way that three sides of the limiting frame 6 are respectively attached to the first interface board 5.2, the second interface board 5.3 and the main flight control circuit board 4. The last side closely matches with the arc-shaped lock slot 1.3 of the upper shell 1 by an arc-shaped convex platform. The inertial measurement device 3 is fastened in the upper shell 1 through the limiting frame 6, so that the parts are tightly installed to form a compact and firm structure. Thus, the damping effect of the inertial measurement device 3 is improved.

The bottom cover 7 is installed on the upper shell 1, and the bar bump 7.1 of the bottom cover 7 is locked into the notch 6.4 of the limiting frame 6. The bottom cover 7 compacts the inertial measurement device 3 and the limiting frame 6 to complete the installation of the entire control device. The installation structure described above make the structure of the control device compact and the inertial measurement device 3 installation stable. The installation structure reduces the influence of the vibration frequency of the unmanned aerial vehicle on inertial measurement device 3, and improves the stability and precision of inertial measurement device 3. In this embodiment, the control device has a high integration level and small volume, and improves the reliability of the entire control device.

The embodiment provides an unmanned aerial vehicle, which includes the control device described above. The arrangement of the control device described above can improve the precision of detection and control of the unmanned aerial vehicle, and improve the flight reliability of unmanned aerial vehicle system.

INDUSTRIAL APPLICABILITY

The present disclosure provides a control device for unmanned aerial vehicle and an unmanned aerial vehicle, which improve the integration level and reduce the influence of vibration on the control device.

What is claimed is:

1. A control device for an unmanned aerial vehicle, comprising:
   a shell;
   an inertial measurement device, which is fixed in the shell;
   a main flight control circuit board, which is electrically connected to the inertial measurement device; and
   a flexible interface board, which is electrically connected to the main flight control circuit board and is appressed against an inwall of the shell,
   wherein, at least one external device is connected to two opposite sides of the flexible interface board through the shell.

2. The device according to claim 1, wherein the flexible interface board comprises:
   a first interface board and a second interface board, which are opposite to each other; and
   a first flexible board, which is connected to the first interface board and the second interface board,
   wherein the first interface board and the second interface board are provided with a plurality of pin headers electrically connected to the external device, and the first flexible board is electrically connected to the main flight control circuit board.

3. The device according to claim 2, wherein the flexible interface board further comprises:
   a flexible power supply board, which is electrically connected to the second interface board; and
   a second flexible board, which is electrically connected to the flexible power supply board,
   wherein the second flexible board is located between the flexible power supply board and the second interface board, the second flexible board is used to shield the electromagnetic interference between the flexible power supply board and the second interface board.

4. The device according to claim 3, wherein a plurality of header connectors is provided on opposite sides of the shell, the pin headers on the first interface board and the second interface board are electrically connected to the external device through the header connectors.

5. The device according to claim 4, wherein the first interface board and the second interface board each is fixed on the inside of a respective one of the header connecters by a fastener;
   a plurality of limiting boards each is provided the outside of one of the first interface board and the second interface board, and the limiting boards are locked in the header connectors.

6. The device according to claim 5, further comprising a limiting frame disposed in the shell and nested outside the inertial measurement device, wherein the first interface board, the main flight control circuit board and the flexible power supply board are respectively attached to the outside of three sides of the limiting frame.

7. The device according to claim 6, wherein a lock bump is provided on an extended part of a side surface of the limiting frame, an interstice is formed between the lock bump and a sidewall of the limiting frame, and an end of the flexible power supply board, closing to the first flexible board, is placed in the interstice.

8. The device according to claim 7, wherein the shell comprises an upper shell and a bottom cover which are connected to each other, slots are opened on opposite sides of the upper shell, the header connecters are detachably plugged into the slots, the limiting boards are locked in the slots, a limiting convex platform is provided on the ceiling of the upper shell, the inertial measurement device is limited by the limiting convex platform and is supported by the bottom cover.

9. The device according to claim 7, wherein an arc bump is provided on a side of the limiting frame without the first interface board, the main flight control circuit board and the flexible power supply board, a lock slot for locking the arc bump is provided on an inwall of the upper shell;
   a notch is provided at the top of a side of the limiting frame, a bar bump is provided on the bottom cover and is configured to be locked in the notch.

10. An unmanned aerial vehicle, comprising a control device, wherein the control device comprises:
    a shell;
    an inertial measurement device, which is fixed in the shell;
    a main flight control circuit board, which is electrically connected to the inertial measurement device; and a flexible interface board, which is electrically connected to the main flight control circuit board and is appressed against an inwall of the shell,
wherein, at least one external device is connected to two opposite sides of the flexible interface board through the shell.

11. The unmanned aerial vehicle according to claim 10, wherein the flexible interface board comprises:
a first interface board and a second interface board, which are opposite to each other; and
a first flexible board, which is connected to the first interface board and the second interface board,
wherein the first interface board and the second interface board are provided with a plurality of pin headers electrically connected to the external device, and the first flexible board is electrically connected to the main flight control circuit board.

12. The unmanned aerial vehicle according to claim 11, wherein the flexible interface board further comprises:
a flexible power supply board, which is electrically connected to the second interface board; and
a second flexible board, which is electrically connected to the flexible power supply board,
wherein the second flexible board is located between the flexible power supply board and the second interface board, the second flexible board is used to shield the electromagnetic interference between the flexible power supply board and the second interface board.

13. The unmanned aerial vehicle according to claim 12, wherein a plurality of header connectors is provided on opposite sides of the shell, the pin headers on the first interface board and the second interface board are electrically connected to the external device through the header connectors.

14. The unmanned aerial vehicle according to claim 13, wherein the first interface board and the second interface board each is fixed on the inside of a respective one of the header connecters by a fastener;
a plurality of limiting boards each is provided the outside of one of the first interface board and the second interface board, and the limiting boards are locked in the header connecters.

15. The unmanned aerial vehicle according to claim 14, further comprising a limiting frame disposed in the shell and nested outside the inertial measurement device, wherein the first interface board, the main flight control circuit board and the flexible power supply board are respectively attached to the outside of three sides of the limiting frame.

16. The unmanned aerial vehicle according to claim 15, wherein a lock bump is provided on an extended part of a side surface of the limiting frame, an interstice is formed between the lock bump and a sidewall of the limiting frame, and an end of the flexible power supply board, closing to the first flexible board, is placed in the interstice.

17. The unmanned aerial vehicle according to claim 16, wherein the shell comprises an upper shell and a bottom cover which are connected to each other, slots are opened on opposite sides of the upper shell, the header connecters are detachably plugged into the slots, the limiting boards are locked in the slots, a limiting convex platform is provided on the ceiling of the upper shell, the inertial measurement device is limited by the limiting convex platform and is supported by the bottom cover.

18. The unmanned aerial vehicle according to claim 16, wherein an arc bump is provided on a side of the limiting frame without the first interface board, the main flight control circuit board and the flexible power supply board, a lock slot for locking the arc bump is provided on an inwall of the upper shell;
a notch is provided at the top of a side of the limiting frame, a bar bump is provided on the bottom cover and is configured to be locked in the notch.

* * * * *